(12) United States Patent
Matsuhira et al.

(10) Patent No.: US 7,453,543 B2
(45) Date of Patent: Nov. 18, 2008

(54) DISPLAY DEVICE

(75) Inventors: Tsutomu Matsuhira, Chiba (JP); Hiroki Hanawa, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/875,113

(22) Filed: Jun. 23, 2004

(65) Prior Publication Data

US 2004/0263759 A1    Dec. 30, 2004

(30) Foreign Application Priority Data

Jun. 27, 2003    (JP)    ............................. 2003-183780

(51) Int. Cl.
*G02F 1/1345*    (2006.01)

(52) U.S. Cl. ........................ 349/150; 349/149; 349/151; 349/152

(58) Field of Classification Search ......... 349/149–152, 349/73
See application file for complete search history.

(56) References Cited

U.S. PATENT DOCUMENTS

| 6,669,869 | B2 * | 12/2003 | Yamaguchi et al. | ......... 252/512 |
| 6,954,184 | B2 * | 10/2005 | Kurashima et al. | ........... 345/1.3 |
| 7,233,382 | B2 * | 6/2007 | Yamaji et al. | ............... 349/150 |

* cited by examiner

*Primary Examiner*—David C. Nelms
*Assistant Examiner*—Phu Vu
(74) *Attorney, Agent, or Firm*—Adams & Wilks

(57) ABSTRACT

A display device has a first flexible substrate having a connection terminal and a driver integrated circuit for supplying driving signals. A second flexible substrate is connected to the connection terminal of the first flexible substrate. A pair of display panels are connected to the respective first and second flexible substrates for sharing driving signals supplied by the driver integrated circuit to drive the display panels.

15 Claims, 4 Drawing Sheets

DISPLAY DEVICE

BACKGROUND OF THE INVENTION

1. Field of the Invention

The present invention relates to a display device that is mounted in a portable telephone, an information terminal, a handy terminal, or the like. In particular, the present invention relates to a connection structure of a driver IC that drives two display elements that are arranged in front and in back. Display elements such as STN and TFT liquid crystal elements, organic EL elements, FEDs, and LEDs can be used as the display elements.

2. Description of the Related Art

Conventionally, STN liquid crystal display elements are formed by disposing two transparent substrates, on which transparent electrodes and an orientation film of polyimide or the like are arranged, such that surfaces thereof having the transparent electrodes face each other, and liquid crystals are held in a gap between the transparent electrode surfaces. Segmented electrodes that apply a data signal to a display screen are formed on one of the transparent substrates, and a common electrode that scans lines is formed on the other transparent substrate as a, transparent electrode, thus forming a dot matrix. Applying a time divided voltage to each of the electrodes drives the screen. A segmented signal and a common signal differ from each other. An output electrode of a driver IC is connected to each of the electrodes that constitute the dot matrix, and the signals are applied. The driver IC that outputs the segmented signals and the common signal is constituted by one chip when the number of pixels is on the order of 160×128 dots. For screens having a higher number of pixels, a dedicated driver is used for each segmented signal driver IC and each common driver IC. In some cases, a plurality of driver ICs are used, depending to a relationship between the number of driver signals output from the driver ICs and the number of pixels.

The majority of portable telephones that have been commercialized in recent years are of a shell type that opens into two pieces. A main screen and a back surface sub-screen are mounted to this type of portable telephone as display screens, and display is performed on both screens. The two screens are constituted by separate display panels (refer to JP 2000-338483 A, for example) A method in which screens are displayed by driver ICs that are provided to separately drive each of the display panels, and a method in which two screens are driven by a driver IC that is adapted to the total number of pixels in the display screens of the two display panels, are known (refer to JP 2001-282145 A, for example). For cases where the latter method is used in an STN liquid crystal display device, for example, a film substrate on which the driver IC is mounted is connected to a terminal portion of a main display panel. A connection terminal that supplies an input signal to a sub-display-panel is provided on an edge of the sub-display panel that faces the terminal portion of the main display panel, and the connection terminal and the sub-display panel are connected by a film substrate. Signal electrodes of the main display panel and the sub-display panel share their segmented signals, and display is made on the main panel and the sub-panel by their dedicated common signals. The connection between the film substrate, on which the driver IC is mounted, and the main display panel is made by using an anisotropic conductive film. Common signal electrodes are disposed on both sides of a connection terminal of a segmented signal electrode. The common signal electrodes include a common signal electrode that is used by the main display panel, and in addition, another common signal electrode that is used by the sub-display. panel and that is disposed on an outer side of the common signal electrode of the main display panel. The common signal electrodes are connected by using an anisotropic conductive film. The common signal electrode used by the sub-display panel is wired via an outer circumference of the main display panel. The segmented signal electrode is wired to the connection electrode while being directly drawn out via-the screen.

Further, a display device that performs front and back display by dividing the area of one display panel, and applying the divided portions to the front and the back of a polarizing plate, has been achieved as another method (refer to JP 10-198291 A, for example).

However, problems such as those discussed below exist with the conventional dual screen panels described above.

(1) With the method in which the main panel is connected to the driver IC, and the sub-panel and the main panel are connected by an FPC, (flexible printed circuit), the outer shape of the main panel becomes large because the common electrode that is used exclusively by the sub-panel is formed along the outer shape of the main panel. Further, costs thus increase because the number of main panels that can be cut out from one substrate decreases.

(2) With the method in which the area of the one display panel is divided and applied to the front and the back of the polarizing plate, the placement of the main panel and the sub-panel becomes planar, and this limits design. Further, for cases where panel types such as a transmission color panel and a semi-transmission color panel are combined for the main panel and the sub-panel, color filters become expensive.

(3) Driver ICs for a number of output signals equal to the sum of the number of pixels in the main panel and the sub-panel are necessary in the methods described above. In particular, it is necessary to provide dedicated driver ICs for the common signal output terminals, resulting in increased cost.

SUMMARY OF THE INVENTION

An object of the present invention is to reduce driver IC cost by making a main panel frame smaller and by sharing signals between driver ICs that respectively drive the main panel and a sub-panel in driving both screen displays.

In order to solve the problems with conventional structures, a display device of the present invention has a driver IC mounted to a first flexible substrate, and a main display panel and the first flexible substrate are connected together. A terminal that is provided on a first film substrate, and a second film substrate that is connected to a sub-panel, are connected together. Alternatively, the second film substrate, which is connected to the sub-panel, is connected to a terminal that is provided adjacent to a connection portion of the main display panel, which is connected to the first film substrate. By using this type of structure, it becomes unnecessary to dispose a common signal electrode used exclusively by the sub-display panel in an outer circumference of the main display panel. Further, common signals can be shared in addition to segmented signals. Accordingly, the sub-panel can also be driven by a driver IC that is adapted to the number of pixels of the main display panel, and thus an inexpensive driver IC can be used.

DETAILED DESCRIPTION OF THE PREFERRED EMBODIMENTS

A display device according to the present invention includes: a first display panel; a second display panel; a first flexible substrate that is connected to the first display panel; a second flexible substrate that is connected to the second display panel; a driver IC that is provided to the first flexible substrate to drive the first display panel and the second display panel; and a connection terminal portion that is provided to the first display panel or the first flexible substrate to connect to the second flexible substrate. Driver signals for driving the first display panel are supplied from the driver IC to the first display panel, and at least a part of the driver signals for driving the first display panel is supplied to the second display panel via the connection terminal portion.

That is, the display device includes the first display panel, the second display panel that is connected to the second flexible substrate, and the first flexible substrate on which the driver IC that drives the first display panel and the second display panel are provided. The driver IC and the connection portion that connects to the second flexible substrate are provided on the first flexible substrate. The first display panel is connected to the first flexible substrate. Driver signals that are output from the driver IC are supplied to the first display panel from the first flexible substrate. Driver signals for the second display panel, which are output from the driver IC, are supplied to the second display panel from the connection terminal of the first flexible substrate, via the second flexible substrate.

Further, a display device of the present invention includes a first display panel, a second display panel that is connected to a second flexible substrate, and a first flexible substrate on which a driver IC that drives the first display panel and the second display panel is mounted. The first display panel is connected to the first flexible substrate, and has a connection portion for connection to the second flexible substrate. Driver signals that are output from the driver IC are supplied from the first flexible substrate to the first display panel. On the other hand, driver signals that are output from the driver IC for the second display panel are supplied to the second display panel from a terminal portion provided to the first display panel, via the second flexible substrate.

Embodiments of an STN liquid crystal display device according to the present invention are explained in detail below.

Embodiment 1

Figure 1:
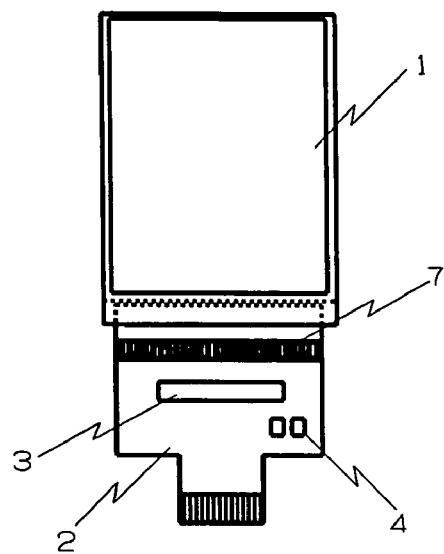
FIG. 1 is a schematic top view that shows a first embodiment of the present invention.
Figure 2:
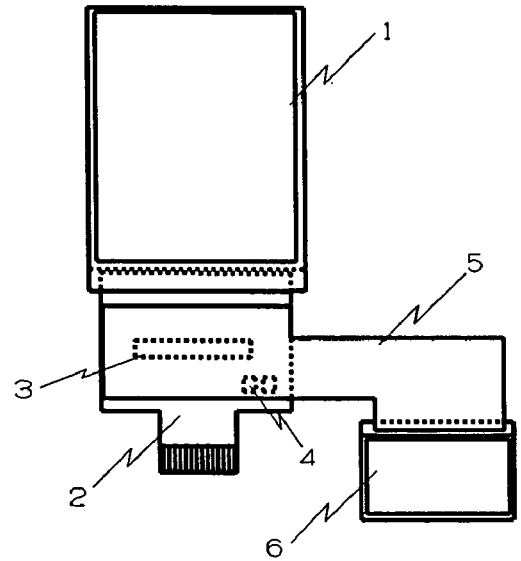
FIG. 2 is a schematic top view that shows the first embodiment of the present invention.
Figure 3:
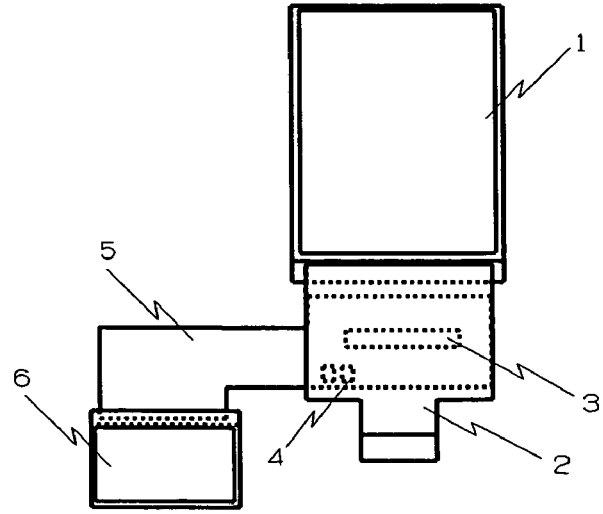
FIG. 3 is a schematic top view that shows the first embodiment of the present invention.
Figure 4:
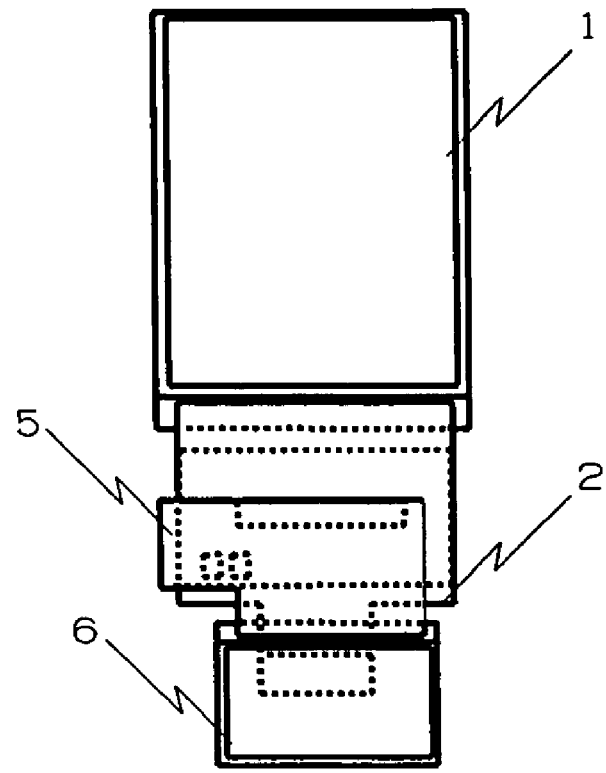
FIG. 4 is a schematic top view that shows the first embodiment of the present invention.
Figure 5:
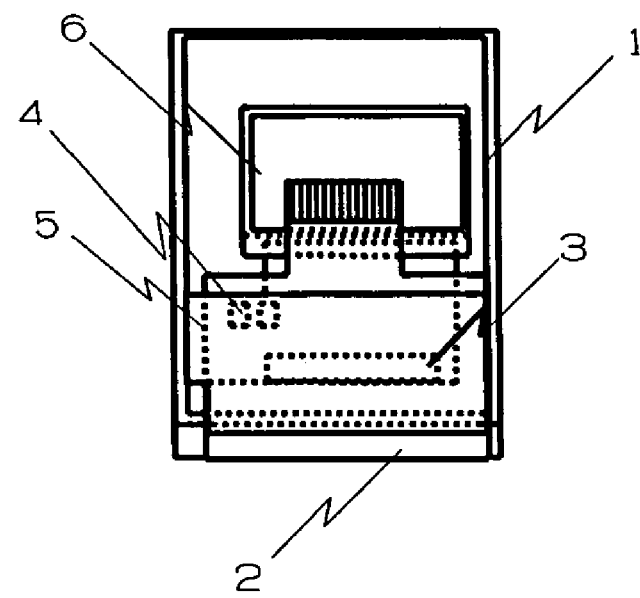
FIG. 5 is a schematic top view that shows the first embodiment of the present invention.

A process of assembling a dual screen liquid crystal display device according to Embodiment 1 is explained based on FIG. 1 to FIG. 5. FIG. 1 shows a state where a first flexible printed circuit (FPC) 2, on which a driver IC 3 and chip resistors 4 are mounted, is connected to a main panel 1 constituting of a transmission color liquid crystal panel. The state shown here is seen from a display screen of the main panel 1. The connection between the main panel 1 and the FPC 2 is made by using an anisotropic conductive film. The main panel 1 has 128×160 dots of pixels. A connection terminal portion 7 is provided to the PFC 2. Electrode terminals are provided in the connection terminal portion. Segmented signals and common signals to be supplied to a sub-panel are extracted from the electrode terminals. Electrode terminals for extracting the segmented signals and the common signals to be supplied to the main panel 1 may also be provided in the connection terminal. Further, for cases where the segmented signals of the main panel and the segmented signals of the sub-panel are common, at least two types of signal electrodes may be provided to the connection electrode portion, a sub-panel common signal electrode and segmented signal electrode for the segmented signals of the main panel that are used in common by the sub panel. Further, the terminal pitch of the connection terminal portion 7 is set to 50 μm. FIG. 2 is a top view that shows a state where a second flexible printed circuit (FPC) 5, which is connected to a sub-panel 6, is connected to the connection terminal portion 7 of the FPC 2. The sub-panel in FIG. 2 is in a state as seen from a back surface side, that is, the rear side of the display screen. The sub-panel 6 is a semi-transmitting color liquid crystal panel that is provided with an inner surface mirror, and has 96×64 dots of pixels. A pattern that connects from the connection terminal portion 7 to the sub-panel 6 is provided to the second FPC 5. For cases where electrodes not connected to the sub-panel 6 are formed in the connection terminal portion 7, dummy electrodes may also be formed in positions of the connection terminal of the second FPC 5 opposite to those electrodes. The connection terminal 7 of the FPC 2 and the second FPC 5 are connected by thermal compression bonding by using an anisotropic conductive film. The connection between the subpanel 6 and the second FPC 5 may be made before or after the thermal compression bonding connection. Front and back are then reversed, resulting in a state shown in FIG. 3. A state where a back surface of the main panel and a display surface of the subpanel can be seen is shown in FIG. 3. The second FPC 5 is then folded, resulting in a state shown in FIG. 4. Then, the FPC 2 is further folded, resulting in a state shown in FIG. 5. The back side of the main panel is a display surface in FIG. 5, while the side of the sub-panel visible in FIG. 5 is the display surface. A backlight that emits light to both surfaces is disposed, or backlights that illuminate the main panel 1 and the subpanel 6, respectively, are disposed, between the main panel 1 and the sub-panel 6. The backlight may also be disposed before bending the FPC 2. With this type of configuration, for cases where the segmented electrode (signal) of the sub-panel uses a signal that is identical to the segmented signal of the main panel, the display device can be viewed without the sub-panel being inverted right to left, even if different viewers are looking at the display at the same time from the front and back sides of the display device.

An interface (I/F) (terminal portion into which signals from external circuits are input) in a position that overlaps with the sub-panel is bent and connected to a connector that supplies signals. It is preferable that the same material be used in the FPC 2 and the second FPC 5. Metaloyal manufactured by Toyo Metallizing Co., Ltd., in which copper is formed by sputtering and copper plating by using Kapton 100EN manufactured by DuPont Toray Co., Ltd as a base, is used in this embodiment.

A driver that possesses signal outputs corresponding to the number of pixels of the main panel and the sub-panel may be used as the driver IC. Alternatively, a driver IC that possesses signal outputs corresponding to the number of pixels of the main panel may also be used for the signals of the sub-panel.

Embodiment 2

Figure 6:
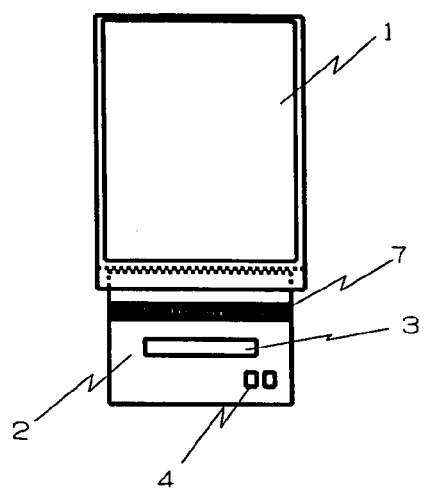
FIG. 6 is a schematic top view that shows a second embodiment of the present invention.
Figure 7:
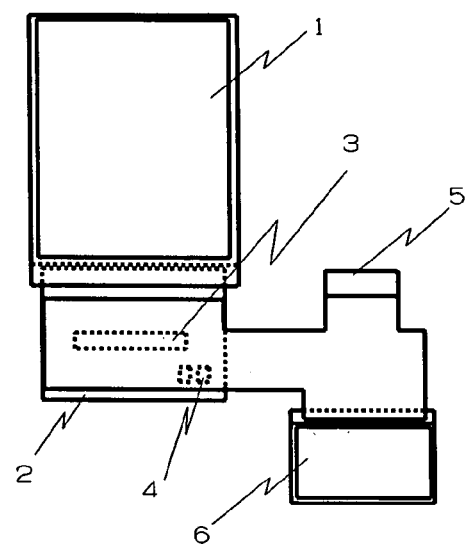
FIG. 7 is a schematic top view that shows the second embodiment of the present invention.
Figure 8:
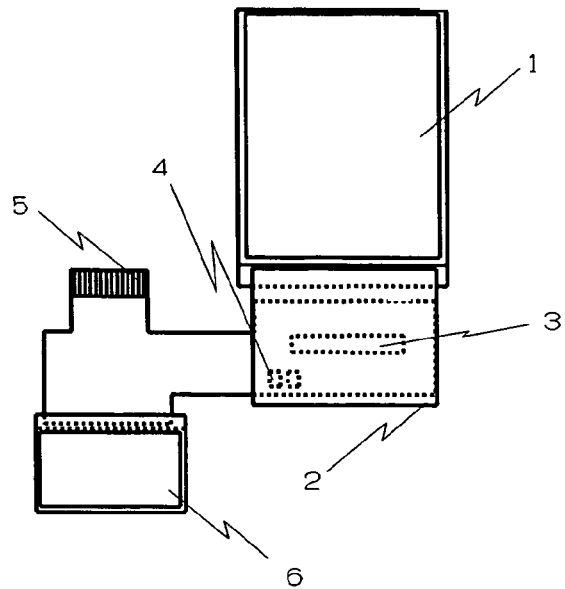
FIG. 8 is a schematic top view that shows the second embodiment of the present invention.
Figure 9:
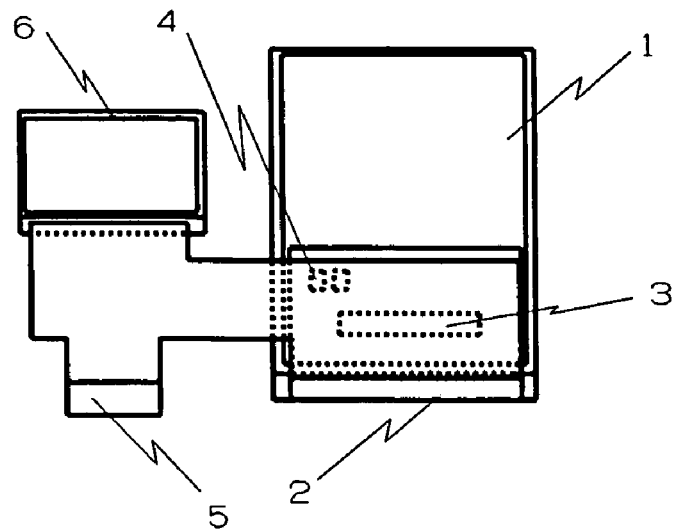
FIG. 9 is a schematic top view that shows the first embodiment of the present invention.
Figure 10:
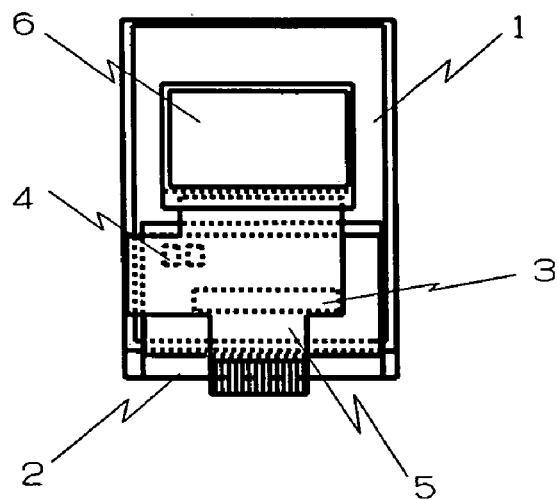
FIG. 10 is a schematic top view that shows the first embodiment of the present invention.

A configuration for a case where a terminal portion that is connected to an external portion is provided to the second FPC is explained in Embodiment 2. Explanations that overlap with those of Embodiment 1 are omitted as appropriate. A process of assembling a dual screen display device of Embodiment 2 is explained by using schematic diagrams of FIG. 6 to FIG. 10. FIG. 6 is a top view in which the FPC 2, on which the driver IC 3 and the chip resistors 4 are mounted, is connected to the main panel 1, a transmission color liquid crystal panel. The connection between the main panel 1 and the FPC 2 is made by using an anisotropic conductive film. The main panel 1 has 128×160 dots of pixels. The connection terminal 7 is provided to the FPC 2. The connection terminal 7 consists of input signal terminals that supply signals, which are the same as those connected to the main panel 1, to electrodes, ICs, chip resistors, and the like. The pitch between the electrodes of the connection terminal 7 is 45 µm. FIG. 7 is a top view in which the second FPC 5 is mounted on the sub-panel 6. The sub-panel 6 is a semi-transmission color liquid crystal panel that is provided with an inner surface mirror, and has 96×64 dots of pixels. An I/F between a pattern that connects to the sub-panel 6 from the connection terminal 7, and the external portion is provided to the second FPC 5. Dummy electrodes are formed in positions of the connection terminal of the second FPC 5 opposite to electrodes of the connection terminal 7 that are not connected to the sub-panel 6. The connection terminal 7 of the FPC 2 and the second FPC 5 are connected by thermal compression bonding by using an anisotropic conductive film. The connection between the sub-panel 6 and the second FPC 5 may be made before or after this thermal compression bonding process. The device is next reversed from front to back, resulting in a state shown in FIG. 8. The FPC is then bent, resulting in a state shown in FIG. 9. The second FPC 5 is then bent, resulting in a state shown in FIG. 10. A backlight that emits light to both surfaces is prepared, or backlights are prepared for the main panel 1 and the sub-panel 6, respectively, to be disposed between the main panel 1 and the sub-panel 6. The backlight may also be disposed before bending the FPC 2.

The I/F and a connector that supply signals are then connected. It is preferable that the same material be used in the FPC 2 and the second FPC 5. Polyimide film substrates are used as the flexible substrates in Embodiment 2. Specifically, Metaloyal manufactured by Toyo Metallizing Co., Ltd., in which copper is formed by sputtering and copper plating by using Kapton 100EN manufactured by DuPont Toray Co., Ltd as a base, is used in this embodiment. Connection made between FPCs by using an anisotropic conductive film uses the anisotropic conductive film employed in connecting the panels and the FPCs. The anisotropic conductive film is tacked to one of the FPCs through positional alignment with the other FPC. The connection can easily be made provided that the positional relationship at this point is correct, with little positional displacement arising due to elongation caused by thermal compression bonding.

An IC that possesses output signals corresponding to the number of pixels of the main panel is used as the driver. The same applies to the case in which a plurality of driver ICs are used depending on the screen size.

Figure 11:
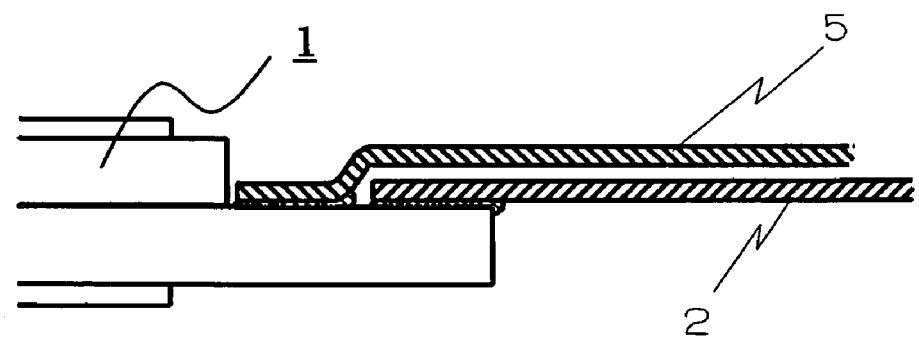
FIG. 11 is a schematic cross sectional view that shows another embodiment of the present invention.

Although the FPC 2 and the second FPC 5 are connected in each of the embodiments described above, the FPC 2 and the second FPC 5 may also be connected to the main panel 1 as shown in FIG. 11.

The display panels are not limited to STN type display panels. TFT liquid crystal display devices may also be used. Further, low temperature polysilicon TFTs in which a portion of the driver is built-in may also be used in the main panel. The display type may be liquid crystal and may also be organic EL.

As explained above, by employing the configuration of the present invention, the main panel and the sub-panel can be connected by using one chip, without making the outer shape of the main panel larger. Further, restrictions on the arrangement of the sub-panel are eliminated. Furthermore, the signals of the main panel and the sub-panel can all be shared, and it thus becomes possible to provide an inexpensive dual screen display device.

What is claimed is:

1. A display device comprising:
a first display panel;
a second display panel;
a first flexible substrate connected to the first display panel;
a second flexible substrate connected to the second display panel and to the first flexible substrate;
a connection terminal portion formed on the first flexible substrate for interconnecting the first flexible substrate to the second flexible substrate; and
a driver integrated circuit that receives input signals from external circuits via the first flexible substrate, the driver integrated circuit being mounted to the first flexible substrate for supplying driving signals to the first display panel to drive the first display panel and for supplying at least part of the driving signals to the second display panel via the connection terminal portion to drive the second display panel.

2. A display device according to claim 1; wherein the first display panel comprises a transmission color liquid crystal display panel and the second display panel comprises a semi-transmitting color liquid crystal display panel.

3. A display device according to claim 1; further comprising an anisotropic conductive film connecting the first display panel to the first flexible substrate.

4. A display device according to claim 1; wherein the connection terminal portion interconnects the first flexible substrate to the second flexible substrate by thermal compression bonding using an anisotropic conductive film.

5. A display device according to claim 1; wherein the second flexible substrate does not have wires for supplying input signals to the driver integrated circuit.

6. A display device comprising: a first display panel having a connection terminal portion; a first flexible substrate connected to the first display panel; a second display panel; a second flexible substrate connected to the second display panel and to the connection terminal portion of the first display panel; and a driver integrated circuit that receives input signals from external circuits via the first flexible substrate, the driver integrated circuit being mounted to the first flexible substrate for supplying driving signals to the first display panel to drive the first display panel and for supplying driving signals to the second display panel via the first flexible substrate to drive the second display panel.

7. A display device according to claim 6; wherein the first display panel comprises a transmission color liquid crystal display panel and the second display panel comprises a semi-transmitting color liquid crystal display panel.

8. A display device according to claim 6; further comprising an anisotropic conductive film connecting the first display panel to the first flexible substrate.

9. A display device according to claim 6; wherein the connection terminal portion interconnects the first flexible substrate to the second flexible substrate by thermal compression bonding using an anisotropic conductive film.

10. A display device according to claim 6; wherein the second flexible substrate does not have wires for supplying input signals to the driver integrated circuit.

11. A display device comprising: a first flexible substrate having a connection terminal and a driver integrated circuit that receives input signals from external circuits via the first flexible substrate and that supplies driving signals; a second flexible substrate connected to the connection terminal of the first flexible substrate; and a pair of display panels connected to the respective first and second flexible substrates for sharing driving signals supplied by the driver integrated circuit to drive the display panels.

12. A display device according to claim 11; wherein the pair of display panels comprise first and second display panels; and wherein the first display panel comprises a transmission color liquid crystal display panel and the second display panel comprises a semi-transmitting color liquid crystal display panel.

13. A display device according to claim 12; further comprising an anisotropic conductive film connecting the first display panel to the first flexible substrate.

14. A display device according to claim 11; wherein the connection terminal portion of the first flexible substrate is connected to the second flexible substrate by thermal compression bonding using an anisotropic conductive film.

15. A display device according to claim 9; wherein the second flexible substrate does not have wires for supplying input signals to the driver integrated circuit.

* * * * *